(12) United States Patent
Lu

(10) Patent No.: US 6,946,849 B1
(45) Date of Patent: Sep. 20, 2005

(54) CIRCUIT FOR CALIBRATING A RESISTANCE

(75) Inventor: Jinghui Lu, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/869,010

(22) Filed: Jun. 15, 2004

Related U.S. Application Data

(62) Division of application No. 10/043,636, filed on Jan. 9, 2002, now Pat. No. 6,765,377.

(51) Int. Cl.[7] ......................................... G01R 35/00
(52) U.S. Cl. ................................................. 324/601
(58) Field of Search ........................ 324/601, 130, 324/616; 327/51–55

(56) References Cited

U.S. PATENT DOCUMENTS

| | | | |
|---|---|---|---|
| 6,448,815 B1 * | 9/2002 | Talbot et al. ................. | 326/86 |
| 6,549,071 B1 | 4/2003 | Paul et al. | |
| 2003/0090318 A1 * | 5/2003 | Ryoo et al. .................... | 330/10 |

OTHER PUBLICATIONS

Jafar Savoh and Behzad Razavi; "A 10Gb/S CMOS Clock and Data Recovery Circuit with Frequency Detection"; 2001 IEEE International Solid-State Circuits Conference; Digest of Technical Papers; First Edition; Feb. 5-7, 2001; pp. 78-79, 434.

* cited by examiner

Primary Examiner—Anjan Deb
Assistant Examiner—Amy He
(74) Attorney, Agent, or Firm—Arthur Joseph Behiel; Kim Kanzaki; John King

(57) ABSTRACT

A circuit for calibrating a resistance between a first circuit node and a second circuit node is disclosed. The circuit comprises a reference resistor connected between first and second reference nodes; a first transistor having a first current-handling terminal connected to the first reference node, a second current-handling terminal, and a first control terminal; and a second transistor having a third current-handling terminal connected to the first circuit node, a fourth current-handling terminal connected to the second circuit node, and a second control terminal connected to the first control terminal.

19 Claims, 4 Drawing Sheets

CIRCUIT FOR CALIBRATING A RESISTANCE

This is divisional of application Ser. No. 10/043,636, filed Jan. 9, 2002, now U.S. Pat. No. 6,765,377.

BACKGROUND

Modern high-speed digital communication systems employ data transmit and recovery circuits operating at or above ten gigabits per second. Due to the bandwidth limitations of conventional CMOS processes, it is difficult to produce an amplifier capable of driving a significant load with better than unity gain at frequencies above about five gigahertz (GHz). At frequencies approaching five GHz, amplifier gain is at the tail portion of the roll-off characteristic.

FIG. 1A (prior art) is a Bode plot depicting a roll-off characteristic for a typical CMOS amplifier. The roll-off (−3 dB) frequency $F_o$ is around several hundred MHz. More exotic processes, such as those employing silicon germanium or gallium arsenide, provide improved high-frequency response; unfortunately, this improvement comes at considerable expense.

FIG. 1B (prior art) depicts a communication system 100 that includes a transmitting integrated circuit (IC) 105 and a receiving IC 110. Transmitting IC 105 includes an output amplifier 115 driving an external pin 120 via a bond pad 125 and a bond wire 130. An electrostatic-discharge (ESD) circuit 135 connects to bond pad 125 and the output of amplifier 115 to protect IC 105 from damage due to ESD events. IC 110 includes an input amplifier 140 that receives the output of IC 105 via a printed-circuit-board (PCB) trace 145, an input pin 150, a bond wire 155, and a bond pad 160. IC 110 also includes an ESD circuit 165 connected to the signal line between pad 160 and the input to amplifier 140.

System 100 illustrates that amplifiers intended to drive signals off chip must contend with capacitive loading far greater than normally experienced on chip. Such signals encounter capacitive loading from e.g. bond pads 125 and 160, bond wires 130 and 155, ESD circuits 135 and 165, PCB trace 145, and the input of amplifier 140. These capacitances collectively shift the pole of output amplifier 115 toward zero, exacerbating the problem of communicating at high frequency.

Also problematic, increased load capacitance reduces amplifier bandwidth. The unity-gain bandwidth of amplifier 115 is defined by $g_m/C_{ld}$, where $g_m$ is the amplifier transconductance and $C_{ld}$ is the capacitive load on the amplifier. Load capacitance $C_{ld}$ is typically in the neighborhood of 1.2 pf, providing a bandwidth typically in the range of several hundred megahertz.

An article by Savoj and Razavi entitled "A 10 Gb/s CMOS Clock and Data Recovery Circuit with Frequency Detection," 2001 IEEE International Solid-State Circuits Conference, describes a CDR circuit that addresses the problem of providing high-frequency signals off chip using relatively inexpensive CMOS processes. That article is incorporated herein by reference.

FIG. 2 (prior art) depicts the output buffer (amplifier) 200 described in the Savoj and Razavi article. Buffer 200 includes an input stage 205 and an output stage 210. Output stage 210 experiences the capacitive loading described above in connection with FIG. 1B. The transistors associated with output stage 210 are relatively large, helping output stage 210 contend with the load. Due to their size, the transistors of output stage 210 present a significant capacitive load (e.g., 0.5 picofarads) to input stage 205. Input stage 205 employs inductive peaking to increase high-frequency, small-signal gain in the face of the input capacitance of output stage 210. Still, there is always a demand for higher performance.

SUMMARY

A buffer in accordance with the invention employs an input stage with an active, LC load. The active load includes integrated inductors that combine with the parasitic gate capacitances of a pair of transistors in a negative-transconductance (−Gm) booster configuration. The resulting active load emphasizes a desired frequency, improving the quality, or "Q," of the input stage, and consequently of the entire buffer.

This summary does not define the scope of the invention, which is instead defined by the appended claims.

DETAILED DESCRIPTION

Figure 1A:
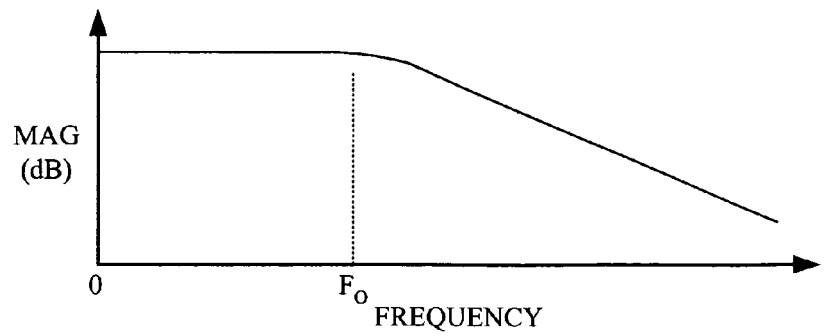
FIG. 1A (prior art) is a Bode plot depicting a roll-off characteristic for a typical amplifier.
Figure 1B:
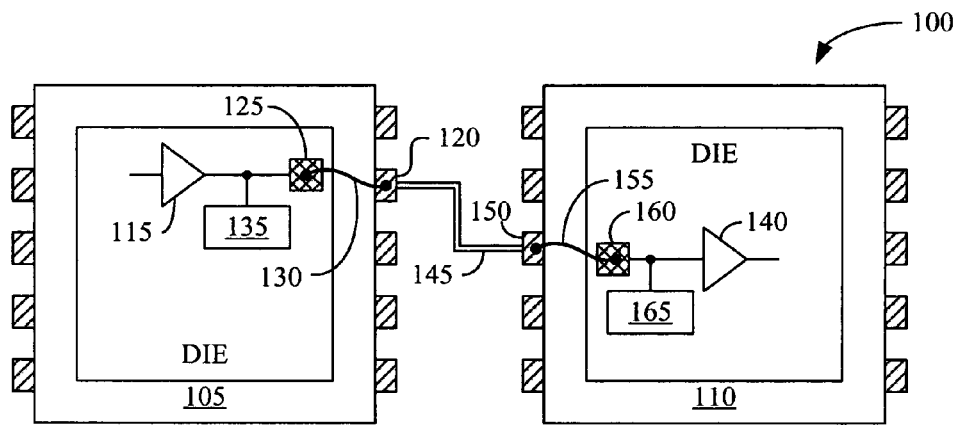
FIG. 1B (prior art) depicts a communication system 100 that includes a transmitting IC 105 and a receiving IC 110.
Figure 2:
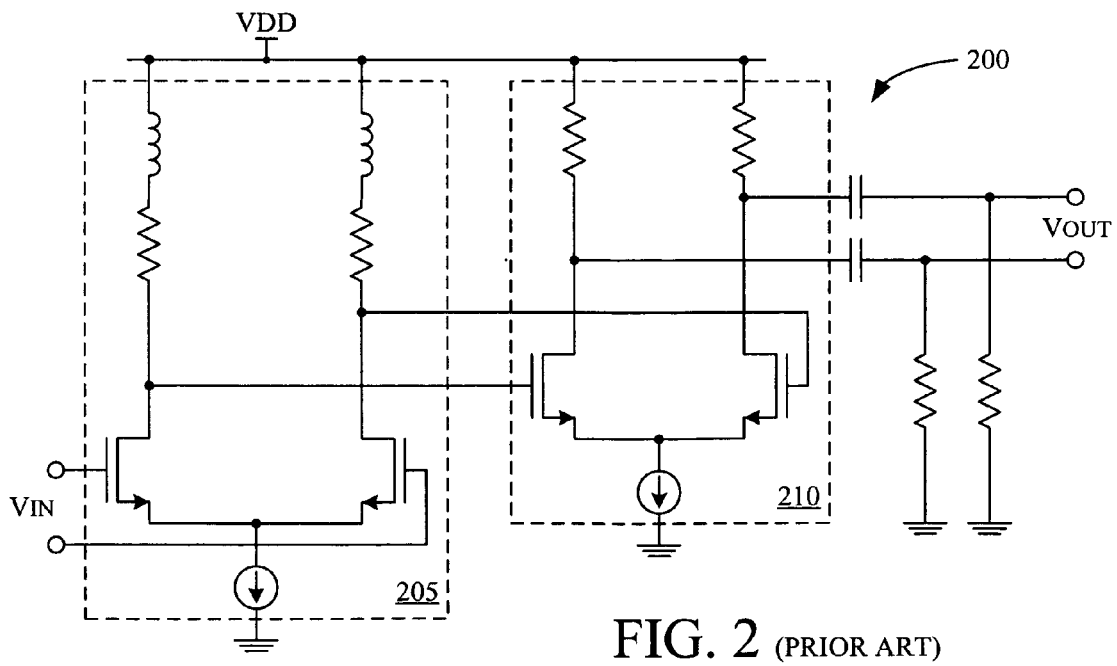
FIG. 2 (prior art) depicts a conventional high-speed output buffer 200.
Figure 3A:
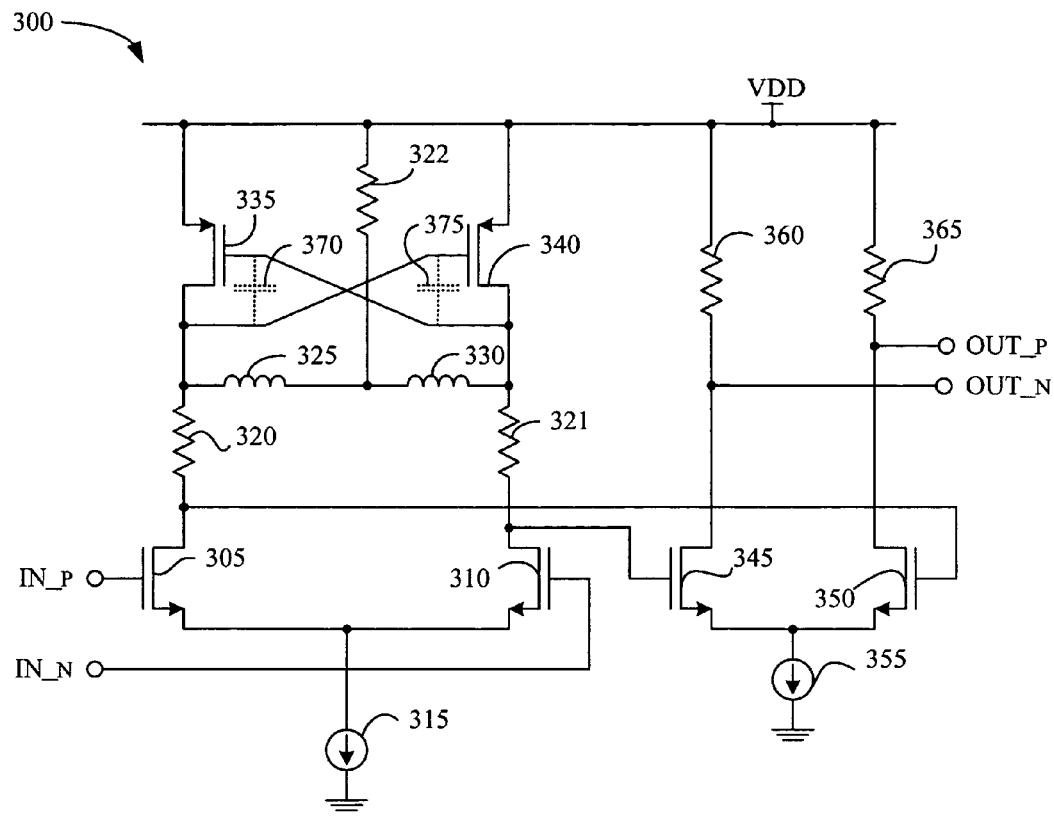
FIG. 3A depicts a buffer 300 in accordance with an embodiment of the invention.

FIG. 3A depicts a buffer 300 in accordance with an embodiment of the invention. Buffer 300 includes a pair of differential input transistors 305 and 310, the sources of which are connected to a power-supply terminal (ground) via a current source 315. The drains of transistors 305 and 310 connect to another power-supply terminal (VDD) via a load that includes three resistors 320–322, a pair of inductors 325 and 330, and a pair of cross-coupled PMOS transistors 335 and 340. Buffer 300 includes an output stage with a pair of differential NMOS transistors 345 and 350, the sources of which are connected to ground via a current source 355. The drains of transistors 345 and 350 are connected to respective buffer output terminals OUT_P and OUT_N, and to VDD via respective termination resistors 360 and 365.

Resistor 322 provides the appropriate bias voltage for transistors 335 and 340. Parasitic gate capacitances 370 and 375 are connected in parallel, each having a first terminal connected to the upper terminal of resistor 320 and a second terminal connected to the upper terminal of resistor 321. Inductors 325 and 330 are connected in series between the same two terminals, so that inductors 325 and 330 combine with capacitances 370 and 375 to form an LC circuit in which the resonant frequency $F_R$ is about:

$$F_R = \frac{1}{2\pi\sqrt{LC}} \qquad \text{Eq. 1}$$

where L is the inductance of each of inductors 325 and 330 and C is the value of each gate capacitance 370 and 375. Other circuit features, such as resistors 320 and 321 and the gate capacitances associated with transistors 345 and 350, also play a role in determining the resonant frequency; however, these effects are ignored here for simplicity.

Transistors 335 and 340 act as a negative-Gm (−Gm) amplifier, amplifying the signals presented on their respective gates. This amplification boosts the Q of the above-described LC circuit, improving the gain response of buffer 300.

Figure 3B:
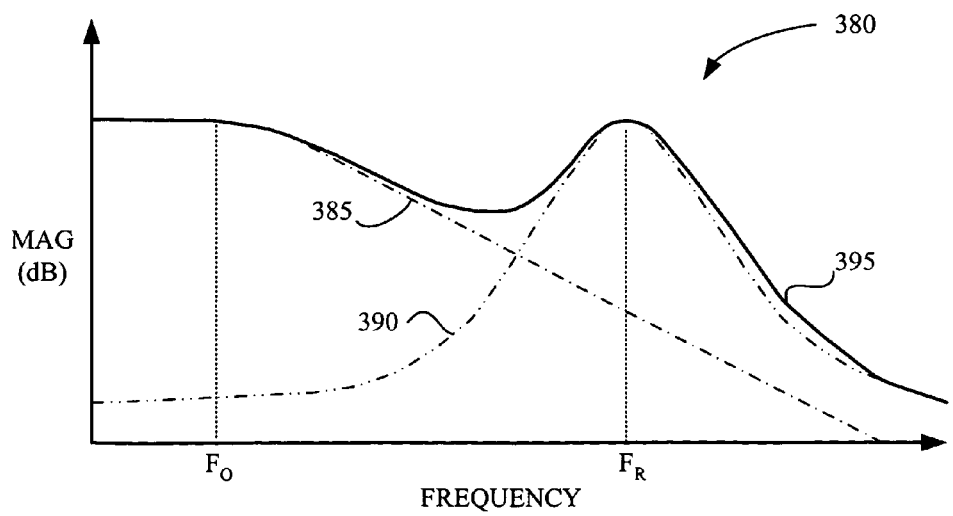
FIG. 3B is a Bode plot 380 illustrating the hypothetical frequency response of a buffer like buffer 300 of FIG. 3A.

FIG. 3B is a Bode plot 380 illustrating the hypothetical frequency response of a buffer like buffer 300 of FIG. 3A. Bode plot 380 includes a plot 385 of amplifier 300 without an inductive LC load and a plot 390 of the frequency response of the LC filter formed principally by inductors 325 and 330 and capacitances 370 and 375. The overall response (plot 395) of buffer 300 is a combination of the responses depicted in plots 385 and 390.

In a specific embodiment fabricated using a 0.18-micron process, resistor 322 is 26 ohms, resistors 360 and 365 are external fifty-ohm termination resistors, and resistors 320 and 321 are integrated 70-ohm resistors. Current source 355 can be impedance matched to resistors 360 and 365.

Inductors 325 and 330 are fabricated as a single, center-taped, 3-turn inductor using the top metal layer. The shape of the inductor is similar to those shown in FIG. 5.3.7 of the above-referenced article by Savoj and Razavi: the inductor is a square "coil" in which the wire width is about 26 microns spaced about 3 microns from adjacent turns of the coil. The resulting inductance is about 2.7 nH. Together with capacitances 335 and 340, inductors 325 and 330 provide a resonant frequency of about 5 GHz. Simulation suggests this embodiment can drive a 1.3 pF load across terminals OUT_P and OUT_N, with worst-case 600 mV swing, single ended, at 10 Gb/s.

Figure 4A:
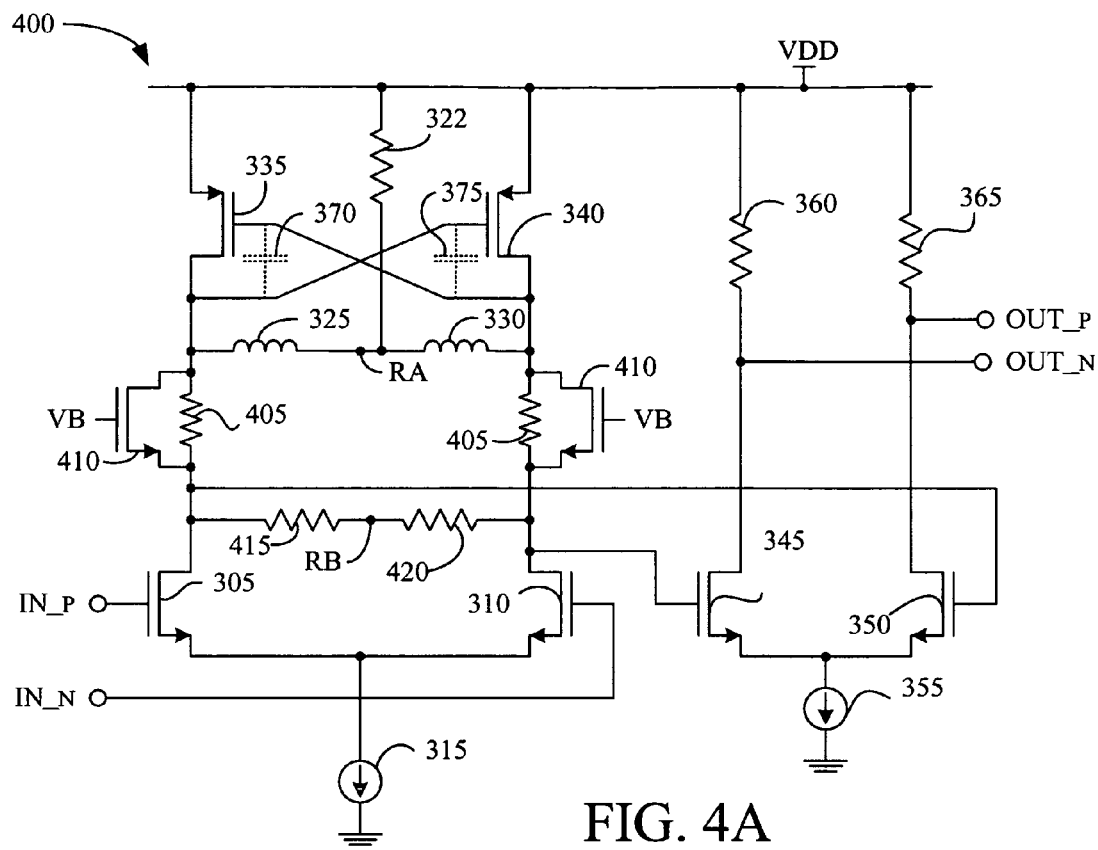
FIG. 4A depicts a buffer 400 adapted in accordance with another embodiment of the invention.
Figure 4B:
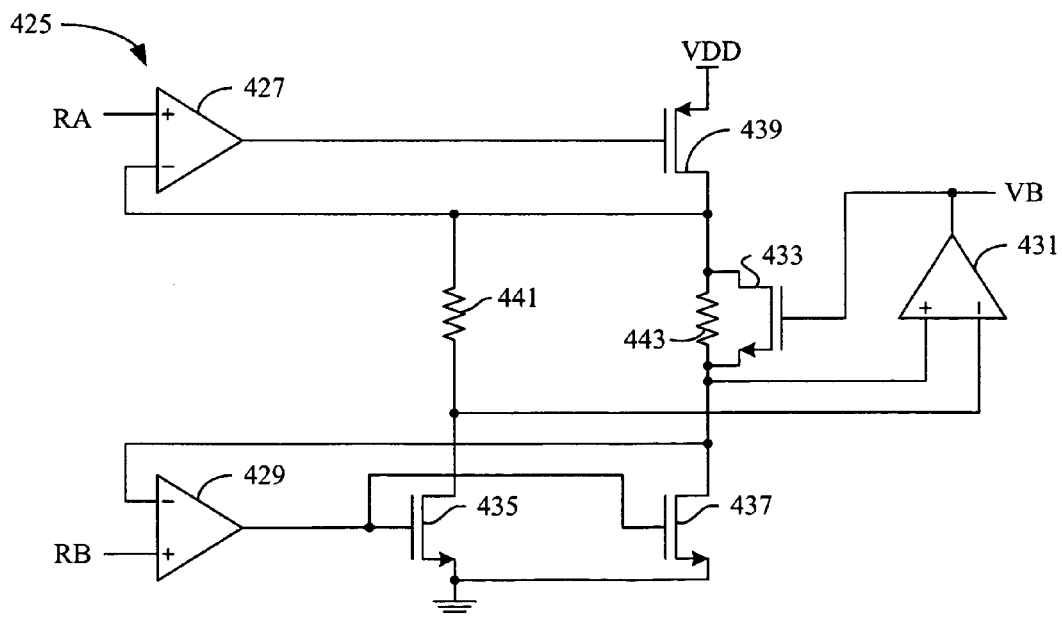
FIG. 4B depicts a resistor calibration circuit 425 used to control the resistance through each leg of the input stage of buffer 400 of FIG. 4A.

Process variations can significantly affect the values of resistors 320 and 321, and consequently the DC gain of buffer 300. FIGS. 4A and 4B depicts a buffer 400 adapted in accordance with another embodiment of the invention to address this problem. Buffer 400 is similar to buffer 300 of FIG. 3A, like-numbered elements being the same. Buffer 400 differs from buffer 300 in that resistors 320 and 321 are replaced with a pair of adjustable, calibrated resistors, each of which includes a resistor 405 connected in parallel with a transistor 410. The gates of transistors 410 are both connected to a control voltage VB that establishes the appropriate resistance through transistors 410, and consequently maintains the appropriate DC gain for the input stage of buffer 400.

Buffer 400 also includes a pair of resistors 415 and 420, 10,000 ohms each in one embodiment. Resistors 415 and 420 define between them a common-mode reference node RB that, with reference node RA between inductors 325 and 330, is used to derive a feedback signal for controlling the resistances through transistors 410.

FIG. 4B depicts a resistor calibration circuit 425 used to develop control voltage VB, and consequently to control the resistance through each leg of the input stage of buffer 400 of FIG. 4A. Calibration circuit 425, transistors 410, and resistors 405 provide calibrated resistances between the nodes on either side of resistors 405. Calibration circuit 425 includes three differential amplifiers 427, 429, and 431; three NMOS transistors 433, 435, and 437; a PMOS transistor 439; and a pair of resistors 441 and 443. Resistor 443 is defined in the fabrication sequence to be identical to resistors 405; likewise, transistor 433 is defined in the fabrication sequence to be identical to transistors 410. Resistor 441 is a precision resistor, in one embodiment a 60-ohm external resistor. As explained below, resistor 441 acts as a reference to establish the resistances of transistors 410, and consequently the DC gain of the input stage of buffer 400.

Amplifiers 427 and 429 have their non-inverting input terminals connected to respective reference nodes RA and RB of buffer 400. Amplifier 427 and PMOS transistor 439 together form a unity-gain amplifier that provides the voltage on reference node RA to the top terminals of resistors 441 in 443, and to the drain of transistor 433. Amplifier 429 and NMOS transistor 437 form another unity-gain amplifier that provides the voltage on reference node RB to the bottom terminal of resistor 443, the source of transistor 433, and the non-inverting input terminal of amplifier 431.

Transistor 435 mirrors the current through transistor 437, so the current through reference resistor 441 equals the sum of the currents through resistor 443 and transistor 433. Amplifier 431 controls the gate of transistor 433 so that both the inverting and non-inverting inputs to amplifier 431 are at the same potential, so the same voltage is applied across resistor 441, resistor 443, and transistor 433. The combined resistance through resistor 443 and transistor 433 is therefore controlled to be equal to the reference resistance of resistor 441. The control voltage VB provided to the gate of transistor 433 to establish this equivalent resistance is also provided to the gates of transistors 410 to control the resistance through each leg of the input stage of buffer 400, and therefore the gain of proper 400.

Figure 5:
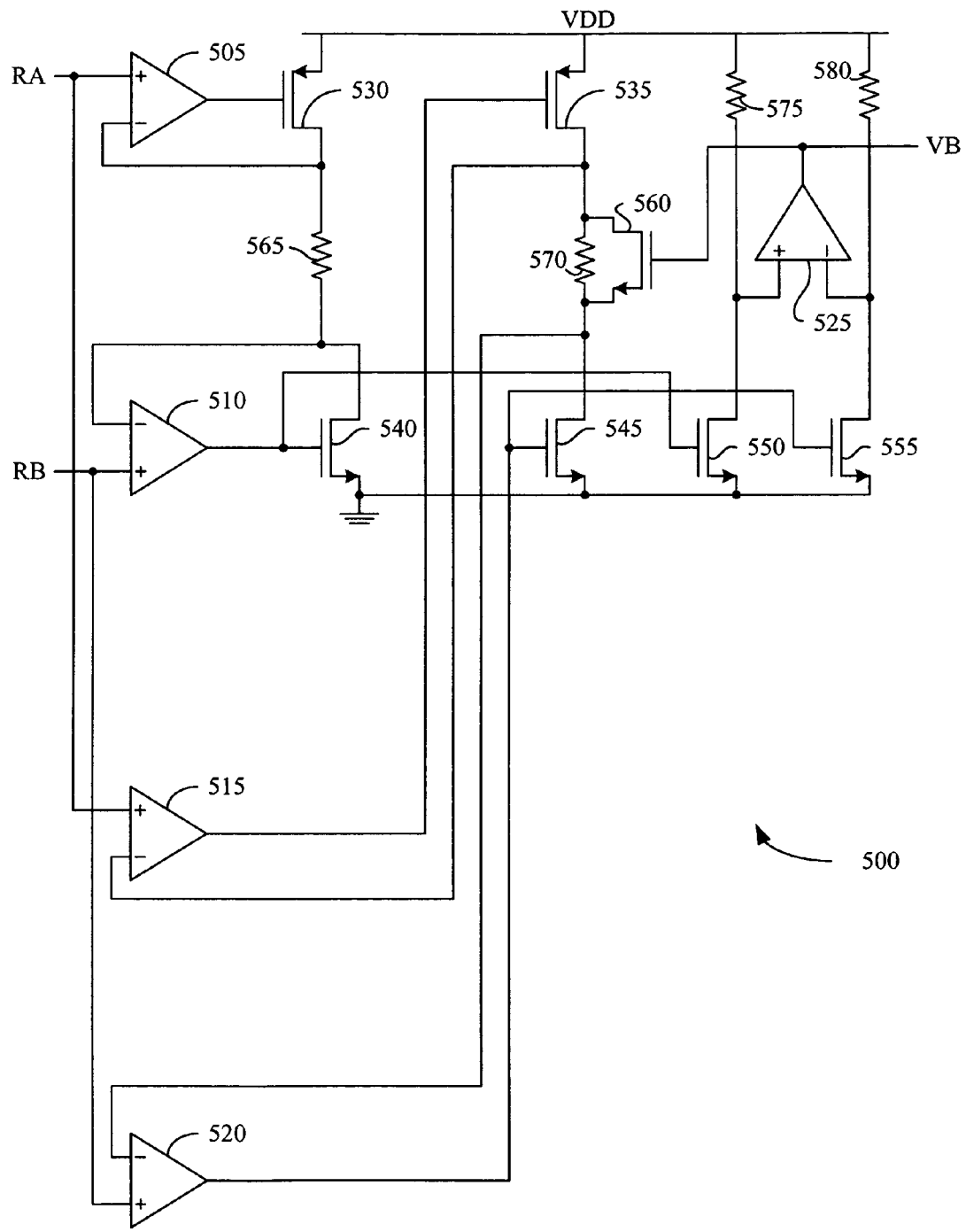
FIG. 5 schematically depicts a resistor calibration circuit 500 in accordance with another embodiment of the invention.

FIG. 5 schematically depicts a resistor calibration circuit 500 in accordance with another embodiment of the invention. Calibration circuit 500 includes five differential amplifiers 505, 510, 515, 520, and 525; two PMOS transistors 530 and 535; five NMOS transistors 540, 545, 550, 555, and 560; and four resistors 565, 570, 575, and 580. Each of amplifiers 505, 510, 515, and 520 connects to a respective transistor in a unity-gain configuration. The voltages on the top and bottom terminals of resistors 565 in 570 are therefore the voltages on reference nodes RA and RB, respectively, of buffer 400 of FIG. 4A.

Resistor 565 is an external, precision resistor. The current through resistor 565 is mirrored through resistor 575 by transistors 540 and 550. Similarly, the combined current through resistor 570 and transistor 560 is mirrored through resistor 580 by transistors 545 in 555. Resistors 575 and 580 are matched, so the voltages on the input terminals of amplifier 525 are equal when the current through resistors 575 and 580 are equal. Amplifier 525 produces the appropriate control voltage VB on the gate of transistor 560 to equalize the resistances through resistor 565 and through the combined resistor 570 and transistor 560, and consequently the voltages on the input terminals to amplifier 525. The control voltage VB required to establish this equivalence is conveyed to the gates of transistors 410 of buffer 400 (FIG. 4A) to control the gain of the input stage of buffer 400.

While the present invention has been described in connection with specific embodiments, variations of these embodiments will be obvious to those of ordinary skill in the art. Moreover, some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A circuit for calibrating a resistance, the circuit comprising:
   a. a first circuit node and a second circuit node having a resistance therebetween;
   b. a reference resistor connected between first and second reference nodes;
   c. a first transistor having a first current-handling terminal connected to the first reference node, a second current-handling terminal, and a first control terminal; and
   d. a second transistor having a third current-handling terminal connected to the first circuit node, a fourth current-handling terminal connected to the second circuit node, and a second control terminal connected to the first control terminal, the second transistor adjusting the resistance between the first circuit node and the second circuit node.

2. The circuit of claim 1, further comprising a differential amplifier having a first differential input terminal connected to the second reference node, a second differential input terminal connected to the second current-handling terminal, and a differential-amplifier output terminal connected to the first and second control terminals.

3. The circuit of claim 2, further comprising a first current source connected to the second reference node and a second current source connected to the second current-handling terminal of the first transistor.

4. The circuit of claim 3, wherein the first current source includes a third transistor having a third-transistor control terminal, the second current source includes a fourth transistor having a fourth-transistor control terminal connected to the third-transistor control terminal.

5. The circuit of claim 1, further comprising a second resistor connected between the first and second circuit nodes.

6. The circuit of claim 1, further comprising a second resistor connected between the first and second current-handling terminals of the first transistor.

7. A circuit for calibrating a resistance between a first circuit node and a second circuit node, the circuit comprising:
   a. a first reference node adapted to provide a first reference voltage;
   b. a second reference node adapted to provide a second reference voltage;
   c. a reference resistor connected between the first and second reference nodes and adapted to conduct a reference current;
   d. a first transistor having a first current-handling terminal, a second current-handling terminal, and a first control terminal, wherein the first transistor is adapted to conduct a second current;
   e. a differential amplifier having:
      i. a first differential input terminal adapted to receive a first input signal of a first magnitude proportional to the reference current;
      ii. a second differential input terminal adapted to receive a second input signal of a second magnitude proportional to the second current; and
      iii. a differential-amplifier output terminal connected to the first control terminal; and
   f. a second transistor having a third current-handling terminal connected to the first circuit node, a fourth current-handling terminal connected to the second circuit node, and a second control terminal connected to the differential-amplifier output terminal.

8. The circuit of claim 7, further comprising a second resistor connected between the first and second current-handling terminals.

9. The circuit of claim 7, further comprising a second resistor connected between the third and fourth current-handling terminals.

10. The circuit of claim 9, further comprising a third resistor connected between the first and second current-handling terminals.

11. The circuit of claim 10, wherein the second and third resistors exhibit equivalent resistances.

12. The circuit of claim 10, wherein the second and third resistors are fabricated together on an integrated circuit, and wherein the reference resistor is external to the integrated circuit.

13. The circuit of claim 7, wherein the reference current and the second current are substantially equal.

14. The circuit of claim 7, wherein the second transistor conducts a third current of a third magnitude, and wherein the second and third magnitudes are substantially equal.

15. A circuit for calibrating a resistance between a first circuit node and a second circuit node, the circuit comprising:
   a. a reference resistor connected between first and second reference nodes;
   b. a current source connected to the second reference node and adapted to provide a reference current through the reference resistor;
   c. a first transistor having a first current-handling terminal connected to the first reference node, a second current-handling terminal, and a first control terminal, wherein the first and second current-handling terminals are adapted to conduct a second current; and
   d. a differential amplifier having:
      i. a first differential input terminal adapted to receive a first input signal of a first magnitude proportional to the reference current;
      ii. a second differential input terminal adapted to receive a second input signal of a second magnitude proportional to the second current; and
      iii. a differential-amplifier output terminal connected to the first control terminal.

16. The circuit of claim 15, further comprising a second transistor having a third current-handling terminal connected to the first circuit node, a fourth current-handling terminal connected to the second circuit node, and a second control terminal connected to the first control terminal.

17. The circuit of claim 16, further comprising a second resistor connected between the third and fourth current-handling terminals of the second transistor.

18. The circuit of claim 15, further comprising a second resistor connected between the first and second current-handling terminals of the first transistor.

19. The circuit of claim 15, further comprising a second current source adapted to provide the second current through the first transistor.

* * * * *